United States Patent
Haraguchi et al.

(12) 
(10) Patent No.: US 6,479,215 B2
(45) Date of Patent: Nov. 12, 2002

(54) PHOTOSENSITIVE RESIN PLATE FOR LETTERPRESS PRINTING

(75) Inventors: Keiichi Haraguchi, Fuji (JP); Katsuya Nakano, Fuji (JP)

(73) Assignee: Asahi Kasei Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/555,293

(22) PCT Filed: Nov. 27, 1998

(86) PCT No.: PCT/JP98/05341

§ 371 (c)(1),
(2), (4) Date: May 26, 2000

(87) PCT Pub. No.: WO99/28788

PCT Pub. Date: Oct. 6, 1999

(65) Prior Publication Data

US 2002/0034706 A1 Mar. 21, 2002

(30) Foreign Application Priority Data

Nov. 28, 1997 (JP) .............................. 9-341898

(51) Int. Cl.⁷ .................. G03C 1/76; G03C 1/805; G03F 7/09; G03F 7/11; G03F 7/30
(52) U.S. Cl. ............... 430/273.1; 430/271.1; 430/306; 101/456; 101/457; 101/462
(58) Field of Search ............... 430/306, 273.1, 430/271.1; 101/456, 457, 462

(56) References Cited

U.S. PATENT DOCUMENTS

| 4,510,227 A | * | 4/1985 | Mohr er al. ................. 430/175 |
| 4,957,845 A | * | 9/1990 | Isono et al. ................. 430/156 |
| 4,970,037 A | * | 11/1990 | Kafka et al. ................. 264/101 |
| 5,593,811 A | | 1/1997 | Loerzer et al. ............. 430/258 |
| 6,054,249 A | * | 4/2000 | Nagahara et al. ......... 430/273.1 |
| 6,117,621 A | * | 9/2000 | Hatakeyama et al. ....... 430/326 |
| 6,326,132 B1 | * | 12/2001 | Toya et al. ................. 430/523 |

FOREIGN PATENT DOCUMENTS

| EP | A2342650 | 11/1989 |
| JP | A5149803 | 4/1976 |
| JP | A5468224 | 6/1979 |
| JP | A56110941 | 9/1981 |
| JP | A263050 | 3/1990 |
| JP | A6127100 | 5/1994 |
| JP | A6127101 | 5/1994 |
| JP | A980744 | 3/1997 |
| JP | A9127688 | 5/1997 |
| JP | A9160225 | 6/1997 |
| JP | 9-160226 | * 6/1997 |
| JP | A9160226 | 6/1997 |

OTHER PUBLICATIONS

Machine–Assisted English translation of JP 9–160226 (from Japan Patent Office), Jun. 20, 1997.*

* cited by examiner

*Primary Examiner*—Janet Baxter
*Assistant Examiner*—Sin J. Lee
(74) *Attorney, Agent, or Firm*—Birch, Stewart, Kolasch & Birch, LLP

(57) ABSTRACT

A water-developable, photosensitive resin plate for letterpress printing which comprises a photosensitive resin layer and a protective film contacting therewith, wherein the protective film consists of at least two layers, of which one is a surface layer containing a resin having a water absorption of 5% by weight or less and the other is an intermediate layer containing a water-soluble resin in contact with the photosensitive resin layer.

8 Claims, No Drawings

PHOTOSENSITIVE RESIN PLATE FOR LETTERPRESS PRINTING

This application is the national phase under 35 U.S.C. §371 of PCT International Application No. PCT/JP98/05341 which has an International filing date of Nov. 27, 1998, which designated the United States of America.

TECHNICAL FIELD

The present invention relates to a photosensitive resin plate for letterpress printing, which has a unique protective layer, which offers easy production of a printing plate, good handleability, and is water-developable.

BACKGROUND ART

The "photosensitive resin plate for letterpress printing" referred to in the present invention (hereinafter referred to also as "photosensitive resin plate") is a photosensitive resin composition molded into a thickness of ordinarily 0.5 to 10 mm, sandwiched between two film layers. In such a photosensitive resin plate, one film is peeled; the film-peeled side of the plate is photosensitized via a negative film; the non-photosensitized portion is removed; thereby, a relief is formed.

Formation of the relief (hereinafter referred to also as production of printing plate) is generally conducted by adhering a negative film to a photosensitive resin composition, applying an actinic ray via the negative film to selectively expose the composition to the actinic ray, and then removing the unexposed portion to form a relief.

In the relief formation, the surface of the photosensitive resin composition is sticky in many cases and usually invites various problems. For example, when a negative film is adhered onto the photosensitive resin composition and is later peeled, the peeling is insufficient due to the stickiness of the composition, damaging both the formed relief (printing plate) and the negative film; bubbles form at the time of adhesion of the negative film, making it impossible to achieve uniform adhesion; thus, the reproducibility of the image is low.

The methods adopted most widely for alleviating the above problems include a method which comprises covering the surface of a photosensitive resin composition with a thin protective layer removable with a developing solution. This method is specifically described in, for example, JP-A-51-49803 (a polyvinyl alcohol having a saponification value of 90% or more), JP-A-54-68224 (a water-soluble polymer) and JP-A-56-110941 (a soluble polyamide).

When there is used a photosensitive resin composition developable with an aqueous treating solution, generally a protective layer is used containing a water-soluble polymer (e.g. a polyvinyl alcohol or a water-soluble cellulose) so that the protective layer also is made developable with the aqueous treating solution.

When such a water-soluble polymer is used; however, the following occurs: the resulting photosensitive resin becomes substantially hydrophilic and therefore contains absorbed water; the photosensitive resin is covered with an ultraviolet-transmitting film and used in a vacuum state in order to enable, for light exposure, uniform adhesion of a negative film to the plate; the absorbed water in the photosensitive resin becomes a water vapor owing to the heat of light exposure and vaporizes from the photosensitive resin layer. As a result, there arises a problem that the water vapor softens the protective layer containing a water-soluble polymer, inducing excessive adhesion of the protective layer to the negative film. Further there arises a problem that the excessive adhesion makes it impossible to remove the water vapor, resulting in the formation of bubbles between the negative film and the plate. These problems arise particularly when a large printing plate is produced or after there has been a long exposure time in order to obtain a precise image. If part of the image to be reproduced happens to be at the site(s) where bubbles have been formed, the reproducibility of that part of the image is extremely low.

When the above-mentioned water-soluble polymer is used, there also takes place the following problem. During production of the printing plate, a cover film (ordinarily, PET film) used for protection of a protective layer is peeled, and the protective layer absorbs water and generates small wrinkles (hereinafter referred to also as wrinkles formed by water absorption) at the surface. When the resulting plate material having these small wrinkles is subjected to light exposure, the small wrinkles are reproduced in the relief. These wrinkles formed by water absorption are different in size depending upon the composition of the protective layer and have heights ranging from about 3 $\mu$m to 20 $\mu$m. This problem is a big obstacle to the spread of a water-developable photosensitive resin plate.

To suppress such excessive adhesion and wrinkles formed by water absorption, it was proposed to apply a matting treatment to a cover film to make matte the side of a protective layer which comes in contact with a negative film. This attempt, however, has a problem in that the matting treatment makes the total operational time long and incurs a higher cost and the control of the surface roughness in the matting treatment is very difficult; and also there is a problem in that the matting treatment causes light scattering and the reproduced image has a low resolution. There is a further problem that the matting treatment strengthens the adhesivity of protective film with cover film, reducing the peelability of cover film.

DISCLOSURE OF THE INVENTION

The present invention aims at providing a photosensitive resin plate for letterpress printing, which is developable with an aqueous treating solution, which can suppress excessive adhesion, wrinkles formed by water absorption and excessive adhesion, generated during production of printing plate, which enables excellent peelability, and which is superior in resolution.

The present inventor made an intensive study in order to solve the above problems. As a result, the present inventor found that when the photosensitive layer is protected by a protective layer having a multilayer structure comprising an intermediate layer and a surface layer, wherein the intermediate layer is in contact with the photosensitive layer and contains a water-soluble resin, and wherein the surface layer contains a resin having a water absorption of 5% by weight or less and having substantially no water-developability, that the surface layer surprisingly exhibits water-developability. The present invention has been completed based on the above finding.

The present invention is as follows.

(1) A water-developable photosensitive resin plate for letterpress printing which comprises a hydrophilic photosensitive resin layer and a protective film contacting therewith, wherein the protective film consists of at least two layers, of which one is a surface layer containing a resin having a water absorption of 5% by weight or less and the other is an intermediate layer containing a water-soluble resin which is in contact with the photosensitive resin layer.

(2) A photosensitive resin plate according to item 1, wherein the intermediate layer further contains fine particles of a hydrophobic resin having a water absorption of 5% by weight or less and the weight ratio of the hydrophobic resin fine particles and the water-soluble resin is 95/5 or less.

(3) A photosensitive resin plate according to item 1 or 2, wherein the intermediate layer and/or the surface layer contains an ultraviolet absorber.

BEST MODE FOR CARRYING OUT THE INVENTION

The photosensitive resin plate for letterpress printing used in the present invention generally has a laminated structure consisting of a base film (ordinarily, a polyethylene terephthalate (PET) film) used as a substrate for maintaining dimensional stability, an adhesive layer, a photosensitive resin (composition) layer, a protective layer and a cover film (ordinarily, a PET film) in this order.

The protective layer is ordinarily formed on the back side of the cover film, and the side of the protective layer not in contact with the cover film is adhered to the photosensitive resin layer.

In the present invention, the protective layer consists of at least two layers and has a surface layer and an intermediate layer. The surface layer is in contact with the cover film, and the intermediate layer is in contact with the photosensitive resin layer.

The water-soluble resin used in the intermediate layer according to the present invention can be any resin which is water-dispersible or water-soluble. Specifically, the water-soluble resin can be any resin which is dispersible or soluble in an aqueous washing solution. For the resin, there can be mentioned, for example, polyvinyl alcohol, polyvinylpyrrolidone, water-soluble nylon, sodium polyacrylate, polyacrylamide, polyethylene oxide, polyethyleneimine and water-soluble cellulose derivative. Use of a polyvinyl alcohol is preferred in view of its stability when dissolved in water and the mechanical strength of the film formed therewith.

The fine particles of hydrophobic resin usable in the intermediate layer according to the present invention refer to particles which are composed of a resin having a water absorption of 5% by weight or less and which have particle diameters of 5 $\mu$m or less. Larger particle diameters cause light scattering more easily; therefore, the particle diameters are preferably 2 $\mu$m or less, more preferably 0.5 $\mu$m or less.

As the hydrophobic resin, there can be mentioned, for example, acrylic resin, styrene-based resin, vinyl chloride-based resin, vinylidene chloride-based resin, polyolefin type resin, polyamide type resin, polyacetal type resin, polycarbonate type resin, polyester type resin, polyphenylene sulfide type resin, polysulfone type resin, polyetherketone type resin, polyimide type resin, fluororesin, silicon-based resin, urethane-based resin, urea-based resin, melamine-based resin, guanamine-based resin, epoxy-based resin and phenolic resin. These resins are used in the form of fine particles.

As the method for converting the resin into fine particles, there can be mentioned, for example, suspension or emulsion polymerization in which microgranulation takes place, and microgranulation of a resin by means of heat, solvent or the like. Microgranulation by emulsion polymerization is preferred from a standpoint that the fine particles obtained are stable in the presence of water.

The water absorption of the hydrophobic resin fine particles is preferably 5% by weight or less, more preferably 4% by weight or less because they are added in order to reduce the water absorption of the whole water-soluble resin mixture.

The water-soluble resin and the hydrophobic resin fine particles can be easily made into a thin film by mixing water as a main solvent with an alcohol or a water-soluble organic solvent, which is used to improve the wettability, drying rate, etc., to prepare a solution, mixing the resin and the fine particles into the solution, coating the resulting mixture on a film (e.g. a polyester film) in a film-state, followed by drying. The thin film obtained can have different flexibility and water developability by use of a plasticizer, a surfactant, etc.

When the intermediate layer in the present invention contains hydrophobic resin fine particles, the weight ratio of the hydrophobic resin fine particles and the water-soluble resin is 95/5 or less, preferably 90/10 to 5/95, more preferably 85/15 to 20/80. When the weight ratio is more than 95/5, it is difficult to obtain a water-developable film as a protective layer. When the content of the hydrophobic resin fine particles is low, it is difficult to suppress the formation of wrinkles caused by absorption of water, in peeling of cover film particularly in a highly humid environment.

The thickness of the intermediate layer is selected in a range of 0.1 to 20 $\mu$m, preferably 1 to 10 $\mu$m. When the thickness of the intermediate layer is smaller than 0.1 $\mu$m, the water-developability of the whole protective layer is strikingly low. When the thickness of the intermediate layer exceeds 20 $\mu$m, no further improvement is seen in the effect of the protective layer and the resolution of the relief is low.

The resin constituting the surface layer of the present invention can be any resin having a water absorption of 5% by weight or less and which can transmit an ultraviolet light. Practically, it can be a resin which can exhibit water-developability when used in combination with the intermediate layer. The water absorption is preferably 4% by weight or less, more preferably 3% by weight or less.

The content in the surface layer of the resin having a water absorption of 5% by weight or less is 30% by weight or more, preferably 50% by weight or more, more preferably 70% by weight or more, further preferably 90% by weight or more. When the content is less than 30% by weight, the surface layer has a low film contraction and expansion property and tends to form wrinkles even when the resulting photosensitive resin plate is deformed slightly during handling.

As the resin, there can be mentioned, for example, acrylic resin, styrene-based resin, vinyl chloride-based resin, vinylidene chloride-based resin, polyolefin type resin, polyamide type resin, polyacetal type resin, polycarbonate type resin, polyester type resin, polyphenylene sulfide type resin, polysulfone type resin, polyetherketone type resin, polyimide type resin, fluororesin, silicon-based resin, urethane-based resin, urea-based resin, melamine-based resin, guanamine-based resin, epoxy-based resin, phenolic resin, cellulose type resin and modified cellulose type resin. A modified cellulose type resin is preferred from the standpoints of water-developability, water absorption, resolution and peelability of cover film.

The thickness of the surface layer is in a range of 0.1 to 10 μm, preferably 1 to 5 μm. When the thickness of the surface layer is smaller than 0.1 μm, there is seen a reduction in the preventability of adhesion or suppressability of formation of wrinkles by absorbed water. When the thickness exceeds 10 μm, water-developability is strikingly reduced.

Resolution can be improved greatly by allowing the surface layer and/or the intermediate layer to contain an ultraviolet absorber. Allowing the intermediate layer to contain an ultraviolet absorber is preferred so that the color of the ultraviolet absorber is hardly transferred to a negative film. The addition amount of the ultraviolet absorber varies depending upon the absorption constant of the absorber and it is preferred to control the addition amount so that the ultraviolet light transmittance of film becomes 20 to 70%. When the addition amount is less than 20% by weight, no improvement in resolution is seen and the sensitivity is low. When the addition amount exceeds 70%, the improvement in resolution is low.

As the material for the cover film, there can be mentioned polyethylene terephthalate (PET), polyethylene, polypropylene, polystyrene and other materials. A polyethylene terephthalate (PET) is most suitable in view of the dimensional stability, heat resistance and mechanical properties.

The cover film has a thickness of ordinarily 50 to 250 μm. Solutions of compositions constituting the protective layer according to the present invention are each coated thereon, followed by drying, so that the as-dried thickness may be ordinarily 1 to 10 μm. In this case, to the solutions of the compositions may be added a surfactant, a defoaming agent, a leveling agent, a penetrating agent, etc. in order to improve the coatability of the solutions on the cover film. A corona treatment may be applied in order to improve the adhesivity between the surface layer and the intermediate layer. The thus-formed thin film formed on the cover film is adhered to a photosensitive resin composition, whereby a photosensitive resin plate for letterpress printing can be produced.

A photosensitive resin plate for letterpress printing can also be produced by laminating, on a base film, an adhesive layer, a photosensitive resin (composition) layer, a protective layer and a cover film. In such a photosensitive resin plate for letterpress printing can be used a protective film according to the present invention.

The water-developable photosensitive resin plate for letterpress printing referred to in the present invention means a resin plate which contains a photosensitive resin composition composed generally of a hydrophilic polymer, other polymer and additives such as plasticizer, crosslinkable monomer photoinitiator, stabilizer, sensitizer, surfactant, gelling agent and the like and developable with an aqueous treating solution and which can be used in letterpress printing. As specific examples of the resin plate, there can be mentioned a photosensitive resin plate for letterpress printing using a photosensitive resin composition composed of a sulfonic acid group-containing polyurethane resin as a hydrophilic polymer, a styrene-isoprene block copolymer as other polymer, and, as additives, polybutadiene diacrylate, aliphatic diacrylate, dioctyl fumarate, maleinized polybutadiene, N-ethyltoluenesulfonamide, 2,2-dimethoxyphenylacetophenone, 2,2-di-t-butyl-p-cresol and sodium laurylbenzenesulfonate; a photosensitive resin plate for letterpress printing composed of a photosensitive resin composition containing a phosphoric acid ester group-containing hydrophilic radical copolymer (Zeoflex (trade name), a product of Nippon Zeon Co., Ltd.); and a photosensitive resin plate for letterpress printing composed of a photosensitive resin containing crosslinked resin fine particles (FLEXCEED (trade name), a product of Nipon Paint Co., Ltd.).

As the aqueous treating solution (developing solution) used in production of printing plate, there can be used water or a solution obtained by adding, to water, as necessary a surfactant, a defoaming agent, a dispersing agent, an emulsifier, a corrosion inhibitor, an antiseptic, a pH-controlling agent, etc.

The present invention is described in more detail below by way of Examples. However, the present invention is in no way restricted to these Examples.

EVALUATION TESTS

1) Water Absorption

A resin is made into a film having a thickness of 0.5 to 5 μm, dried a temperature of at 40° C. and a humidity 0.1% for 7 days, and measured for weight x. Then, the film is allowed to absorb water at 40° C. and 80% for 7 days and measured for weight y. The water absorption A of the resin is determined from the following equation.

$$A=100x(y-x)/x$$

2) Water-developability

A photosensitive resin plate was developed using, as an aqueous treating solution, a mixture consisting of 2 parts by weight of sodium borate, 2 parts by weight of octylphenoxy polyoxyethylene ether and 100 parts by weight of water, and then washed at 40° C. while rubbing with a brush made of a nylon thread of 200 μm in diameter. The water-developability of the photosensitive resin plate was rated as ○ when the removal of the unexposed portion was uniform, and as X when the removal of the unexposed portion was nonuniform.

3) Resolution

Highlight dots of 150 line/1% were formed using a negative film for resolution test, and resolution was determined in terms of the depth of groove line of 500 μm in width. A larger depth indicates a higher resolution.

4) Adhesion

The adhesion between a negative film and a photosensitive resin plate for letterpress printing was evaluated while producing printing plates many times with a pattern having an image portion (a light application portion) of 100 cm×100 cm, at a constant exposure intensity and at a constant inside-apparatus temperature within an error of ±2% or less.

A case in which uniform adhesion was possible, no bubbles were present between the negative film and the resin plate after light exposure, and the negative film and the resin plate could be separated, was rated as 5; a case in which bubbles were present at the unexposed portion, but the negative film and the resin plate could be separated and the bubbles gave no adverse effect on the image formed, was rated as 4; a case in which the number of the bubbles formed was 3 or less and the bubbles gave an adverse effect on the image formed, was rated as 3; a case in which the number of the bubbles formed on the image portion was not less than 4 but not more than 10 or the area of the bubbles formed was not less than 5% but not more than 10% of the image portion area, and exact reproduction of image was impossible, was rated as 2; and a case in which the number of the bubbles formed was more than 10 or the area of the bubbles formed was larger than 10% of the image portion area, was rated as 1.

5) Resistance to Wrinkle Formation by Absorbed Water

A photosensitive resin plate for letterpress printing was cut into a piece of 10 cm ×20 cm; the piece was allowed to stand at a temperature of 50° C. at a humidity of 1% or less for 24 hours and then put in a dry state at 20° C. for 2 hours. Thereafter, the cover film of the resin plate was peeled in a chamber of 20° C.×50% RH or 20° C.×70% RH and it was examined whether or not streak-like wrinkles having a height of 5 $\mu$m or more were formed by absorbed water at the surface of the protective layer in a limited period of 5 minutes. A case in which streak-like wrinkles appeared by less than 3 per 200 cm$^2$, was rated as pass; and a case in which streak-like wrinkles appeared by 3 or more per 200 cm$^2$, was rated as fail. A case of pass only in the atmosphere of 20° C.×50% RH was rated as ○; a case of pass in both of the atmosphere of 20° C. '50% RH and the atmosphere of 20° C.×70% RH was rated as ◎; and a case of fail in both of the two atmospheres was rated as X.

Reference Example 1

(1) Synthesis of Sulfonic Acid Group-containing Polyesterdiol

Into a 1,000-ml separable flask provided with a stirrer, a nitrogen-inlet tube and a distillation tube were fed 296 g of dimethyl ester of sodium sulfoisophthalate, 310 g of ethylene glycol, 0.43 g of N,N'-hexamethylenebis(3,5-di-t-butyl-4-hydrocinnamamide (IRGANOX 1098, a product of Ciba-Geigy) and 0.43 g of zinc acetate. The mixture was subjected to a reaction in a nitrogen atmosphere at 200° C. for 5 hours, after which vacuum distillation was conducted to remove unreacted ethylene glycol and obtain a light yellow sulfonic acid group-containing polyesterdiol having a hydroxyl group at an end. The product had a number-average molecular weight of 492 based on the measurement of hydroxyl value.

(2) Synthesis of Sulfonic Acid Group-containing Polyurethane

Into a 3,000-ml separable flask provided with a stirrer, a nitrogen-inlet tube and a distillation tube were fed 39.9 g of the sulfonic acid group-containing polyesterdiol obtained in the above (1), 377.7 g of a polyisoprenediol having a hydroxyl group at each end (number-average molecular weight: 2,439) (Poly IP, a product of Idemitsu Petrochemical Company Limited) and 1.4 g of octylated diphenylamine (NOCRAC AD, a product of Ouchi Shinko Chemical Industrial Co., Ltd.). Thereto were added 1,000 g of dimethylacetamide and 1,000 g of 2-chlorotoluene, and the mixture was made into a uniform solution at 110° C.

Then, 0.11 g of dibutyltin dilaurate and 0.34 g of stannous octoate were added. While 43.1 g of xylylene diisocyanate was dropwise added, a reaction was allowed to take place at 110° C. for 3 hours. Then, vacuum distillation was conducted to remove dimethylacetamide and 2-chlorotoluene and obtain a uniform, transparent sulfonic acid group-containing polyurethane.

(3) Preparation of Photosensitive Resin Composition 49.5 g of the sulfonic acid group-containing polyurethane was kneaded, in a nitrogen atmosphere at 150° C. using a pressure kneader, with 20 g of a styrene-isoprene block copolymer (Cariflex TR 1107, a product of Shell Chemical Ltd.), 2 g of sodium laurylbenzenesulfonate, 5 g of a polybutadiene diacrylate (BAC-45, a product of Osaka Organic Chemical Ind. Ltd.), 1 g of an aliphatic diacrylate (C-2000, a product of THERTOMER), 2 g of dioctyl fumarate, 2 g of 2,2- dimethoxyphenylacetophenone, 10 g of a maleinized polybutadiene (ME-1000-80, a product of Nippon Petrochemical Co., Ltd.), 7.5 g of N-ethyltoluenesulfonamide and 0.1 g of 2,2-di-t-butyl-p-cresol, thereby forming a uniform transparent photosensitive resin composition.

This photosensitive resin composition was sandwiched between a PET film having an adhesive layer and a PET film coated with a silicon-based releasing agent, followed by pressing, thereby forming a photosensitive resin plate for letterpress printing having a given thickness. The PET film coated with a silicon-based releasing agent was peeled for later lamination of a protective layer.

EXAMPLE 1

There was used, as a coating solution of a composition to be used as a surface layer, a solution of 9.5 parts by weight of cellulose acetate butyrate (hereinafter abbreviated to CAB) (CAB-5530-0.4, a product of Eastman Kodak Ltd.) and 0.5 part by weight of a polyoxy ammonium salt dissolved in a mixed solvent consisting of 65 parts by weight of toluene, 7 parts by weight of xylene, 10 parts by weight of cellosolve acetate and 18 parts by weight of ethanol. The solution was coated on a polyethylene terephthalate (hereinafter abbreviated to PET) film having a thickness of 100 $\mu$m, in an as-dried thickness of 1.5 $\mu$m using a gravure roll, followed by drying. The film having a thickness of 1.5 $\mu$m was measured for water absorption, which was 1.5%.

Next, as a coating solution of a composition to be used as an intermediate layer, a solution of a solid consisting of 20 parts by weight of a polyvinyl alcohol (hereinafter abbreviated to PVA) (GH-23, a product of The Nippon Synthetic Chemical Industry Co., Ltd.), 76 parts by weight (as solid content) of an acrylic resin emulsion (TA-523, a product of Harima Chemicals, Inc.) (this emulsion had particle diameters of about 0.06 μm and, when dried, a water absorption of 2%) and 4 parts by weight of an ultraviolet absorber (VF-Y4126, a product of Orient Chemical Industries Limited), dissolved in a mixed solvent consisting of 0.5 part by weight of a surfactant (Phthagent FT-251, a product of NEOS Company Limited), 700 parts by weight of water and 300 parts by weight of ethanol. The solution was coated on the surface layer of the above-obtained material using a gravure roll, to form a new film having a thickness of 3.5 μm.

The above-obtained film was adhered at 130° C. to the photosensitive resin composition obtained in Reference Example 1, in such a way that the intermediate layer contacted with the photosensitive resin layer, thereby forming a photosensitive resin plate for letterpress printing. The resin plate was evaluated and the results are shown in Table 1. As is clear from Table 1, the protective layer was confirmed to form no wrinkle by absorbed water, be developable with an aqueous treating solution, and show a high resolution.

EXAMPLE 2

An operation was conducted in the same manner as in Example 1 except that the PVA used in Example 1 was replaced with hydroxypropylcellulose (hereinafter abbreviated to HPC) (HPC-L, a product of Nippon Soda Co., Ltd.). As is clear from Table 1, the protective layer was confirmed to form no wrinkles due to absorbed water, be developable with an aqueous treating solution, and show a high resolution.

EXAMPLE 3

A film was produced in the same manner as in Example 1 except that the CAB used in Example 1 was replaced with a polystyrene resin (hereinafter abbreviated to PS) (Styron 666, a product of Asahi Chemical Industry Co., Ltd.) and the solvent was changed to ethyl acetate, and was evaluated. The peelability was inferior, but the protective layer was confirmed to form no wrinkles due to absorbed water, be developable with an aqueous treating solution, and show a high resolution. The polystyrene film had a water absorption of 0.1% by weight.

EXAMPLE 4

An operation was conducted in the same manner as in Example 1 except that the intermediate layer contained no ultraviolet absorber. As is clear from Table 1, the protective layer was confirmed to form no wrinkles due to absorbed water and be developable with an aqueous treating solution and superior, although the resolution was slightly low.

EXAMPLE 5

An operation was conducted in the same manner as in Example 1 except that the intermediate layer contained no acrylic resin emulsion. As is clear from Table 1, the protective layer was confirmed to be developable with an aqueous treating solution and superior, although it formed slight wrinkles due to absorbed water.

EXAMPLE 6

An operation was conducted in the same manner as in Example 1 except that the acrylic resin emulsion contained in the intermediate layer of Example 1 was changed to a polyvinylidene chloride resin emulsion (hereinafter abbreviated to PVDC) (L-509, a product of Asahi Chemical Industry Co., Ltd.). As is clear from Table 1, the protective layer was confirmed to be developable with an aqueous treating solution and was superior. The PVDC emulsion had a particle diameter of 0.15 μm, and the water absorption was 0.9% by weight.

Comparative Example 1

A resin plate was prepared in the same manner as in Example 1 except that only the acrylic resin emulsion used in Example 1 was used in place of the PVA used in Example 1, as a coating solution for intermediate layer, and was evaluated. As is clear from Table 1, no water-developability was seen and evaluation of resolution was impossible.

Comparative Example 2

A resin plate was prepared in the same manner as in Example 1 except that in the surface layer, the CAB used in Example 1 was changed to the same PVA as used in the intermediate layer of Example 1 and that 70 parts of water and 30 parts of ethanol were used as a solvent for the PVA, and was evaluated. As is clear from Table 1, wrinkles were formed by absorbed water and evaluation of resolution, etc. was impossible. The PVA had a water absorption of 10% by weight.

Comparative Example 3

A resin plate was prepared in the same manner as in Example 1 except that no intermediate layer was formed and a surface layer was directly contacted with a photosensitive resin layer, and was evaluated. As is clear from Table 1, no water-developability was seen and evaluation of resolution, etc. was impossible.

Comparative Example 4

A resin plate was prepared in the same manner as in Example 1 except that no surface layer was formed, a PVA-based layer corresponding to an intermediate layer was directly contacted with a photosensitive resin layer, and no ultraviolet absorber was used, and was evaluated. As is clear from Table 1, wrinkles were formed by absorbed water and evaluation of resolution, etc. was impossible.

TABLE 1

| | Composition of surface layer | Composition of intermediate layer | Ultra-violet absorber | Resistance to wrinkle formation by absorbed water | Water-develop-ability | Adhesion to negative film | Resolution ($\mu$m) |
|---|---|---|---|---|---|---|---|
| Example 1 | CAB | PVA/acrylic resin | Yes | ⊚ | ○ | 4 | 120 |
| Example 2 | CAB | HPC/acrylic resin | Yes | ⊚ | ○ | 4 | 120 |
| Example 3 | PS | PVA/acrylic resin | Yes | ⊚ | ○ | 3 | 120 |
| Example 4 | CAB | PVA/acrylic resin | No | ⊚ | ○ | 4 | 80 |
| Example 5 | CAB | PVA | Yes | ○ | ○ | 4 | 120 |
| Example 6 | CAB | PVA/PVDC | Yes | ⊚ | ○ | 5 | 100 |
| Comparative Example 1 | CAB | Acrylic resin | Yes | ⊚ | X | 4 | *A |
| Comparative Example 2 | PVA | PVA/acrylic resin | Yes | X | ○ | 2 | *B |
| Comparative Example 3 | CAB | No intermediate layer | No | ⊚ | X | 4 | *A |
| Comparative Example 4 | No surface layer | PVA | No | X | ○ | 1 | *B |

*A: No water-developability made the measurement of resolution impossible.
*B: Wrinkle formation gave various resolutions and the evaluation of resolution was impossible.

INDUSTRIAL APPLICABILITY

According to the present invention, there is provided a photosensitive resin plate for letterpress printing, which is developable with an aqueous treating solution, can suppress formation of small wrinkles by absorbed water during production of printing plate, can prevent excessive adhesion to negative film, and shows a high resolution.

What is claimed is:

1. A water-developable photosensitive resin plate for letterpress printing which comprises at least a base film, a photosensitive resin layer, a protective layer and a cover layer in this order, wherein said photosensitive layer contains a hydrophilic polymer in a sufficient amount to make the layer aqueous developable, has a thickness of 0.5 to 10 mm and said protective layer consists of at least two layers, of which one is a surface layer having a thickness in a range of 0.1 to 10 $\mu$m and containing a resin having a water absorption of 5% by weight or less and the other is an intermediate layer containing a water-soluble resin which is in contact with the photosensitive resin layer.

2. A photosensitive resin plate according to claim 1, wherein the intermediate layer further contains fine particles of a hydrophobic resin having a water absorption of 5% by weight or less and the weight ratio of the hydrophobic resin fine particles and the water-soluble resin is 95/5 or less.

3. A photosensitive resin plate according to claim 1 or 2, wherein the intermediate layer and/or the surface layer contains an ultraviolet absorber.

4. A photosensitive resin plate according to claim 2, wherein the hydrophobic resin fine particles have particle diameters of 5 $\mu$m or less.

5. A photosensitive resin plate according to claim 2, wherein the weight ratio of the hydrophobic resin fine particles and the water soluble resin is 85/15 to 20/80.

6. A photosensitive resin plate according to claim 1, wherein the water-soluble resin in the intermediate layer is selected from the group consisting of polyvinyl alcohol, polyvinylpyrrolidone, water-soluble nylon, sodium polyacrylate, polyacrylamide, polyethylene oxide, polyethyleneimine and water-soluble cellulose.

7. A photosensitive resin plate according to claim 1, wherein the thickness of the intermediate layer is in a range of 0.1 to 20 $\mu$m.

8. A photosensitive resin plate according to claim 1, wherein the surface layer has at least 30% by weight of the resin having a water absorption of 5% by weight or less.

* * * * *